(12) United States Patent
Ayabe et al.

(10) Patent No.: US 10,043,692 B2
(45) Date of Patent: Aug. 7, 2018

(54) SUBSTRATE PROCESSING APPARATUS, SUBSTRATE TRANSPORT METHOD, AND COMPUTER-READABLE RECORDING MEDIUM WITH STORED SUBSTRATE TRANSPORT PROGRAM

(71) Applicant: TOKYO ELECTRON LIMITED, Minato-ku (JP)

(72) Inventors: Go Ayabe, Koshi (JP); Kouji Takuma, Koshi (JP)

(73) Assignee: TOKYO ELECTRONICS LIMITED, Minato-ku (JP)

(*) Notice: Subject to any disclaimer, the term of this patent is extended or adjusted under 35 U.S.C. 154(b) by 161 days.

(21) Appl. No.: 15/252,364

(22) Filed: Aug. 31, 2016

(65) Prior Publication Data

US 2017/0062251 A1 Mar. 2, 2017

(30) Foreign Application Priority Data

Sep. 1, 2015 (JP) .................................. 2015-171747

(51) Int. Cl.
  *H01L 21/67* (2006.01)
  *H01L 21/677* (2006.01)

(52) U.S. Cl.
  CPC .. *H01L 21/67265* (2013.01); *H01L 21/67781* (2013.01)

(58) Field of Classification Search
  USPC ....................................................... 700/218
  See application file for complete search history.

(56) References Cited

U.S. PATENT DOCUMENTS 3,977,566 A * 8/1976 Hill ........................ B65G 65/00
                                                                221/222
5,989,346 A * 11/1999 Hiroki ..................... C23C 14/566
                                                                118/719
(Continued)

FOREIGN PATENT DOCUMENTS

JP    2014175608 A  *  1/2006 ........... H01L 21/677
JP    2014-175608 A    9/2014

*Primary Examiner* — Kyle O Logan
(74) *Attorney, Agent, or Firm* — Oblon, McClelland, Maier & Neustadt, L.L.P.

(57) ABSTRACT

A substrate processing apparatus includes a substrate processing device, a substrate accommodation-status detection device, a substrate-transport device including a first substrate-transport sub-device which unloads substrates from a carrier and a second substrate-transport sub-device which unloads the substrates from the carrier, a control device including processing circuitry which controls the first and second substrate-transport sub-devices based on detection result of the substrate accommodation-status detection device. The processing circuitry of the control device determines a selection, based on the result of the substrate accommodation-status detection device, between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier.

20 Claims, 3 Drawing Sheets

(56) References Cited

U.S. PATENT DOCUMENTS

| | | | | |
|---|---|---|---|---|
| 6,508,883 B1* | 1/2003 | Tanguay | ................ | C23C 14/56 |
| | | | | 118/500 |
| 8,317,449 B2* | 11/2012 | Newman | ........... | H01L 21/67115 |
| | | | | 414/217 |
| 2004/0102059 A1* | 5/2004 | Dickinson | ......... | H01L 21/67201 |
| | | | | 438/758 |
| 2010/0129182 A1* | 5/2010 | Ishida | ............... | H01L 21/67781 |
| | | | | 414/222.1 |

* cited by examiner

SUBSTRATE PROCESSING APPARATUS, SUBSTRATE TRANSPORT METHOD, AND COMPUTER-READABLE RECORDING MEDIUM WITH STORED SUBSTRATE TRANSPORT PROGRAM

CROSS-REFERENCE TO RELATED APPLICATIONS

The present application is based upon and claims the benefit of priority to Japanese Patent Application No. 2015-171747, filed Sep. 1, 2015, the entire contents of which are incorporated herein by reference.

BACKGROUND OF THE INVENTION

Field of the Invention

The present invention relates to a substrate processing apparatus capable of transporting substrates from/to a carrier that accommodates multiple substrates, to a method for transporting substrates, and to a computer readable recording medium with a stored substrate transport program.

Description of Background Art

To manufacture semiconductor components, flat panel displays or the like, substrate processing apparatuses are used so that various processes such as cleaning and etching are carried out on substrates, for example, semiconductor wafers, liquid-crystal substrates and the like (for example, JP2014-175608A). The entire contents of this publication are incorporated herein by reference.

SUMMARY OF THE INVENTION

According to one aspect of the present invention, a substrate processing apparatus includes a substrate processing device which processes substrates unloaded from a carrier, a substrate accommodation-status detection device which detects a status of the substrates accommodated in the carrier, a substrate-transport device including a first substrate-transport sub-device which unloads the substrates from the carrier and a second substrate-transport sub-device which unloads the substrates from the carrier, a control device including processing circuitry which controls the first substrate-transport sub-device and the second substrate-transport sub-device based on a detection result of the substrate accommodation-status detection device. The processing circuitry of the control device determines a selection, based on the detection result of the substrate accommodation-status detection device, between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier.

According to another aspect of the present invention, a method for transporting substrates in a substrate processing apparatus includes detecting a status of substrates accommodated in a carrier inside a substrate processing apparatus by a substrate accommodation-status detection device in the substrate processing apparatus, and determining, by a control device including processing circuitry based on a detection result of the substrate accommodation-status detection device, a selection between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier. The substrate processing apparatus includes a substrate-transport device including the first substrate-transport sub-device which unloads the substrates from the carrier and the second substrate-transport sub-device which unloads the substrates from the carrier, and the substrate processing apparatus includes a substrate processing device which processes the substrates unloaded from the carrier.

According to yet another aspect of the present invention, a non-transitory computer-readable medium stored thereon a program that when executed by an information processing apparatus, causes the information processing apparatus to execute a process for transporting substrates in the substrate processing apparatus. The process includes detecting a status of substrates accommodated in a carrier inside a substrate processing apparatus by a substrate accommodation-status detection device in the substrate processing apparatus, and determining, by a control device including processing circuitry based on a detection result of the substrate accommodation-status detection device, a selection between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier. The substrate processing apparatus includes a substrate-transport device including the first substrate-transport sub-device which unloads the substrates from the carrier and the second substrate-transport sub-device which unloads the substrates from the carrier, and the substrate processing apparatus includes a substrate processing device which processes the substrates unloaded from the carrier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
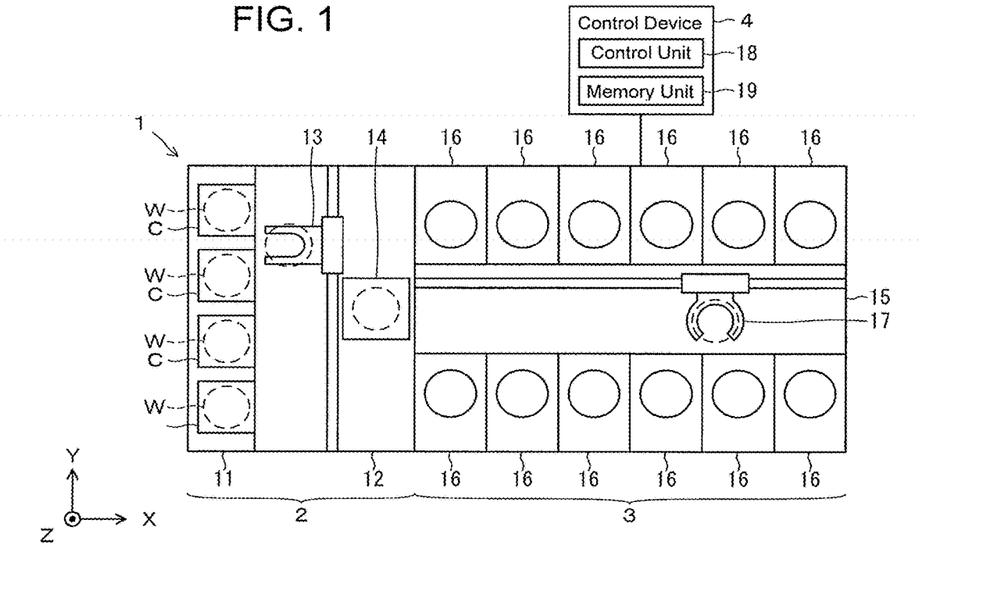
FIG. 1 is a plan view showing a substrate processing apparatus.

FIG. 1 is a view schematically showing the structure of a substrate processing system according to the present embodiment. In the following, X, Y and Z axes intersecting each other at right angles are specified to clarify positional relationships, and a positive direction of the Z axis is set as the vertically upward direction.

As shown in FIG. 1, substrate processing system 1 is provided with loading station 2 and processing station 3. Loading station 2 and processing station 3 are positioned to be adjacent to each other.

Loading station 2 includes carrier mounting zone 11 and transport zone 12. Multiple carriers (C), which horizontally accommodate multiple substrates, namely, semiconductor wafers (hereinafter referred to as wafers (W)) in the present embodiment, are mounted in carrier mounting zone 11.

Transport zone 12 is positioned adjacent to carrier mounting zone 11, and is provided with substrate-transport device 13 and delivery table 14. Substrate-transport device 13 has a substrate holding mechanism for holding wafers (W). Substrate-transport device 13 is capable of moving horizontally and vertically as well as rotating around the vertical axis, and transports wafers (W) between a carrier (C) and delivery table 14 using the substrate holding mechanism.

Processing station 3 is positioned adjacent to transport zone 12. Processing station 3 includes transport zone 15 and multiple processing units 16. Multiple processing units 16 are aligned on each side of transport zone 15.

Substrate-transport device 17 is provided in transport zone 15. Substrate-transport device 17 includes a wafer holding mechanism for holding wafers (W). In addition, substrate-transport device 17 is capable of moving horizontally and vertically as well as rotating around the vertical axis, and transports wafers (W) between delivery table 14 and processing unit 16 using the wafer holding mechanism.

Processing unit 16 conducts predetermined processes on wafers (W) transported by substrate-transport device 17.

Substrate processing system 1 is provided with control device 4. Control device 4 is a computer, for example, and includes control unit 18 and memory unit 19. Memory unit 19 stores a program for controlling various processes executed in substrate processing system 1. Control unit 18 controls operations to be performed in substrate processing system 1 by reading out and executing the program stored in memory unit 19.

Such a program may be stored in a computer-readable recording medium and installed from the recording medium onto memory unit 19 of control device 4. Examples of a computer-readable recording medium are hard disks (HD), flexible disks (FD), compact discs (CD), magneto-optical discs (MO), memory cards and the like.

In substrate processing system 1 structured as above, first, substrate-transport device 13 of loading station 2 unloads a wafer (W) from carrier (C) in carrier mounting zone 11 and mounts the unloaded wafer (W) on delivery table 14. The wafer (W) mounted on delivery table 14 is unloaded from delivery table 14 by substrate-transport device 17 of processing station 3 to be loaded into processing unit 16.

The wafer (W) loaded into processing unit 16 is processed in processing unit 16 and is unloaded from processing unit 16 by substrate-transport device 17 to be mounted on delivery table 14. Then, the processed wafer (W) mounted on delivery table 14 is returned by substrate-transport device 13 to carrier (C) in carrier mounting zone 11.

In carrier (C), thin substrate holding members 21 are formed in main body 20, which is a hollow box with an open back. Substrate holding members 21 are formed at vertically equal intervals on three interior parts—the left, right and rear sides—of main body 20. Accordingly, by supporting the edge of each wafer (W) from below with three substrate holding members 21 aligned vertically, carrier (C) is capable of horizontally accommodating multiple wafers (W) with space allotted at vertical intervals.

Figure 2A:
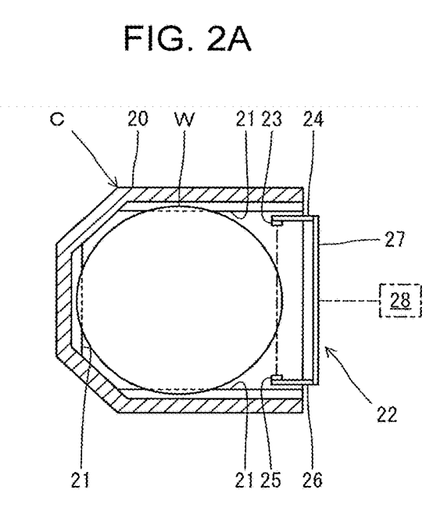
FIG. 2A is a cross-sectional plan view showing a substrate accommodation detection device.
Figure 2B:
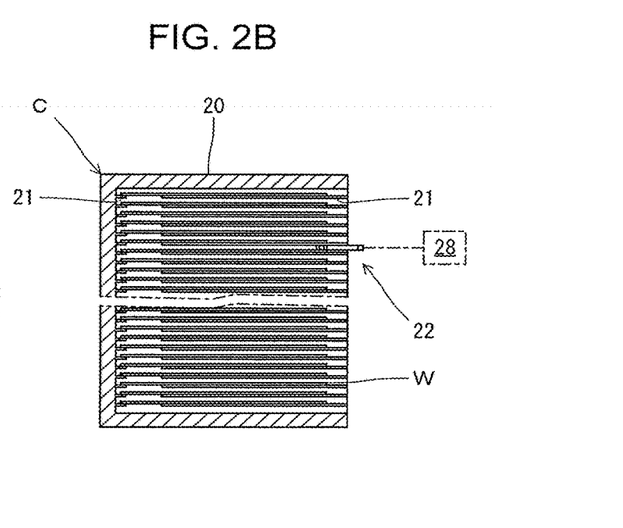
FIG. 2B is a cross-sectional side view showing the substrate accommodation detection device.

In loading station 2, substrate accommodation-status detection device 22 is provided to detect the status of wafers (W) accommodated in carrier (C). As shown in FIG. 2A, arm 24 with light emitter 23 and arm 26 with light receiver 25 are horizontally coupled by connector 27, to which lifting mechanism 28 is attached. Substrate accommodation-status detection device 22 raises/lowers light emitter 23 and light receiver 25 by using lifting mechanism 28 so as to detect the status (for example, vertical positions of wafers (W), thickness of each wafer (W), distance between vertically aligned wafers (W), and the like) of wafers (W) accommodated in carrier (C).

Figure 3:
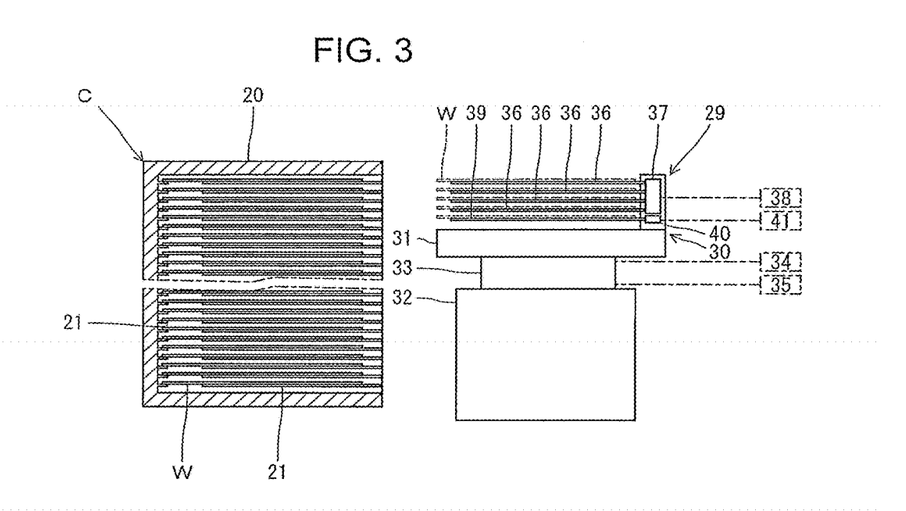
FIG. 3 is a cross-sectional side view showing first and second substrate-transport devices.

In substrate-transport device 13, first and second substrate-transport devices (29, 30) are provided to transport (load/unload) wafers (W) between carrier (C) and delivery table 14. First and second transport devices (29, 30) are vertically aligned on top of base 31. Via support member 33, base 31 is attached to the upper portion of shuttle member 32 capable of traveling in directions Y in transport zone 12. Lifting mechanism 34 to raise/lower base 31 (first and second transport devices (29, 30)) and rotation mechanism 35 to rotate base 31 are connected to support member 33.

First substrate-transport device 29 has four forks 36 for holding wafers (W). In first substrate-transport device 29, four forks 36 are attached to support member 37 in a horizontal position to have vertically allotted equal intervals, and support member 37 is equipped with first retractable mechanism 38.

Second substrate-transport device 30 has only one fork 39 for holding a wafer (W). In second substrate-transport device 30, fork 39 is attached to support member 40 in a horizontal position, and support member 40 is equipped with second retractable mechanism 41.

Forks (36, 39) are vertically aligned with each other at equal intervals in first and second substrate-transport devices (29, 30) respectively. By so setting, when first and second substrate-transport devices (29, 30) are simultaneously driven, maximum five wafers (W) are transported simultaneously from/to carrier (C). More specifically, when first and second retractable mechanisms (38, 41) are simultaneously driven, four upper forks 36 and one lower fork 39 advance simultaneously into carrier (C) and hold wafers (W) when lifting mechanism 34 is driven. Then, first and second retractable mechanisms (38, 41) are simultaneously driven to retrieve forks (36, 39) from inside carrier (C). Accordingly, five wafers (W) are unloaded simultaneously from carrier (C). Under normal operations, five wafers (W) are simultaneously transported so that the throughput is enhanced. However, it is an option to drive only second substrate-transport device 30 if one wafer (W) is desired to be transported for evaluation purposes or the like. Here, by reversing the above unloading procedures, wafers (W) are loaded back into carrier (C). After being processed in processing unit 16, wafers (W) will be returned to their original slots in the carrier (C) from which they are unloaded.

Figure 4:
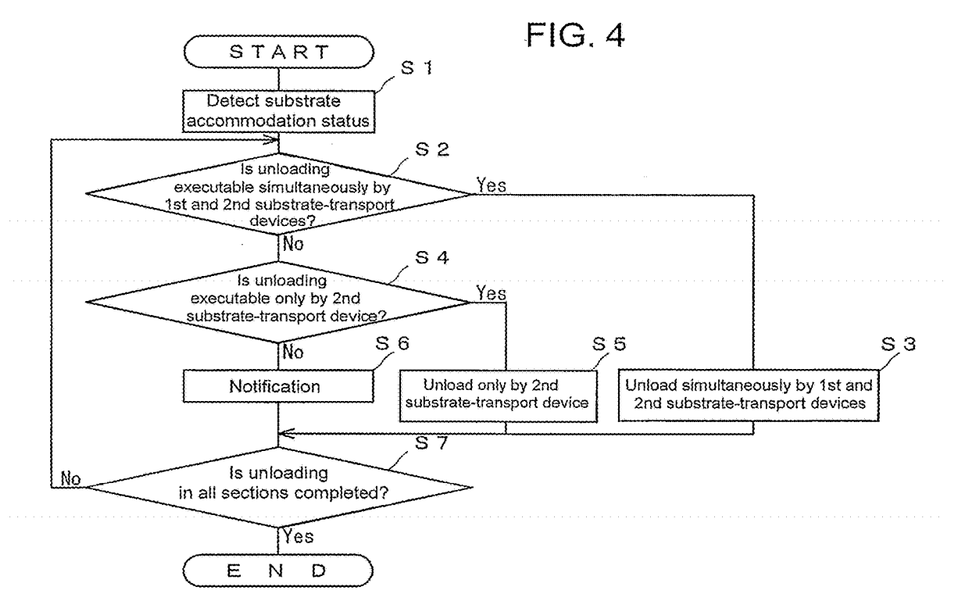
FIG. 4 is a flowchart showing a substrate transport program (when unloading substrates)

In substrate processing system 1, wafers (W) are transported between carrier (C) and delivery table 14 in transport zone 12 according to the substrate transport program stored in memory unit 19 as shown in FIG. 4.

First, in substrate processing system 1, the status of wafers (W) accommodated in carrier (C) is detected by substrate accommodation-status detection device 22 (substrate accommodation-status detection process (S1)).

In substrate accommodation-status detection process (S1), control unit 18 drives lifting mechanism 28 to move light emitter 23 and light receiver 25 from the upper end to the lower end of a carrier (C) while emitting light from light emitter 23 and receiving the light at light receiver 25 so that the accommodation status of wafers (W) is detected. Here, vertical positions of wafers (W) accommodated in the carrier (C), thickness of each wafer (W), and distance between vertically adjacent wafers (W) are measured by substrate accommodation-status detection device 22, and the obtained data are stored in memory unit 19.

Next, substrate processing system 1 determines whether unloading of wafers (W) from carrier (C) is executable by simultaneously using first and second substrate-transport devices (29, 30) (first determination process (S2)).

In first determination process (S2), based on the substrate accommodation-status data stored in memory unit 19, control unit 18 determines whether all the forks (36, 39) of first and second substrate-transport devices (29, 30) can be inserted among wafers (W) vertically aligned to be accommodated in carrier (C). Namely, when all the forks (36, 39) of first and second substrate-transport devices (29, 30) are inserted among wafers (W) vertically aligned to be accommodated in carrier (C), if the lower surface of any of forks (36, 39) and the upper surface of a wafer (W) are at risk of touching each other due to narrow space, that is, unless there is enough space to insert any of forks (36, 39) between the lower surface of an upper fork 39 and the upper surface of a wafer (W) without causing them to touch each other, control unit 18 determines that unloading of wafers (W) from carrier (C) is not executable by simultaneously using first and second transport devices (29, 30).

In first determination process (S2), when unloading of wafers (W) from carrier (C) is determined to be executable by simultaneously using first and second transport devices (29, 30), five wafers (W) are simultaneously unloaded from carrier (C) by using first and second transport devices (29, 30), and are transported to delivery table 14 (first unloading process (S3)).

On the other hand, when unloading of wafers (W) from carrier (C) is determined not to be executable by simultaneously using first and second substrate-transport devices (29, 30) in first determination process (S2), control unit 18 further determines whether five wafers (W) that cannot be unloaded by simultaneously using first and second transport devices (29, 30) can be unloaded from carrier (C) by using only second substrate-transport device 30 (second determination process (S4)).

In second determination process (S4), based on substrate accommodation-status data stored in memory unit 19, control unit 18 determines whether fork 39 of second substrate-transport device 30 can be inserted between wafers (W) vertically aligned to be accommodated in carrier (C). Namely, when fork 39 of second substrate-transport device 30 is inserted between wafers (W) vertically aligned to be accommodated in carrier (C), if the lower surface of fork 39 and the upper surface of a wafer (W) are at risk of touching each other due to narrow space, control unit 18 determines that unloading of a wafer (W) from carrier (C) is not executable by using second substrate-transport device 30.

In second determination process (S4), when unloading of a wafer (W) from carrier (C) is determined to be executable by using second transport device 30, five wafers (W) are unloaded from carrier (C) one at a time by using second transport device 30 and transported to delivery table 14 (second unloading process (S5)).

Meanwhile, when control unit 18 determines in second determination process (S4) that unloading of wafers (W) from carrier (C) is not executable by using second substrate-transport device 30, control unit 18 alerts the operator by sound, light or the like (notification process (S6)).

In notification process (S6), the unloading process of wafers (W) is suspended until the suspension is released by the operator.

In substrate processing system 1, above-described procedures from first determination process (S2) through notification process (S6) are conducted on all the wafers (W) accommodated in carrier (C). During that time, all the wafers (W) accommodated in carrier (C) are divided into a maximum number (five wafers, in the present embodiment) of wafers (W) transportable by both first and second substrate-transport devices (29, 30). Then, procedures from first determination process (S2) through notification process (S6) are conducted section by section. When wafers (W) in all the s have been unloaded, the processing process is determined to be completed (completion determination process (S7)).

As described so far, in substrate processing system 1, wafers (W) are unloaded from carrier (C) to delivery table 14. Meanwhile, at the time of loading (W) from delivery table 14 back to carrier (C), substrate processing system 1 is capable of simultaneously transporting five wafers (W) by using first and second substrate-transport devices (29, 30) simultaneously so that transport time is shortened to enhance throughput. However, if substrate holding members 21 are disfigured or the like due to external force exerted on carrier (C), wafers (W) vertically aligned in carrier (C) are not aligned at equal intervals. Under such conditions, forks (36, 39) positioned at equal intervals may touch wafers (W) during the process of unloading wafers (W). When distances are so small as to cause forks to touch wafers, first and second transport devices (29, 30) are unable to unload five wafers (W) simultaneously. Moreover, forks (36, 39) may also touch wafers (W) during the loading process, making it impossible to load wafers (W) into carrier (C). Accordingly, there is no way to simultaneously load five wafers (W) by using first and second transport devices (29, 30) simultaneously. Therefore, when wafers (W) are unloaded from a carrier (C) by driving only second substrate-transport device 30 (when second unloading process (S5) is executed), wafers (W) are loaded back into the original slots in the carrier (C) by driving only second substrate-transport device 30. By so doing, wafers (W) are securely loaded into carrier (C).

Figure 5:
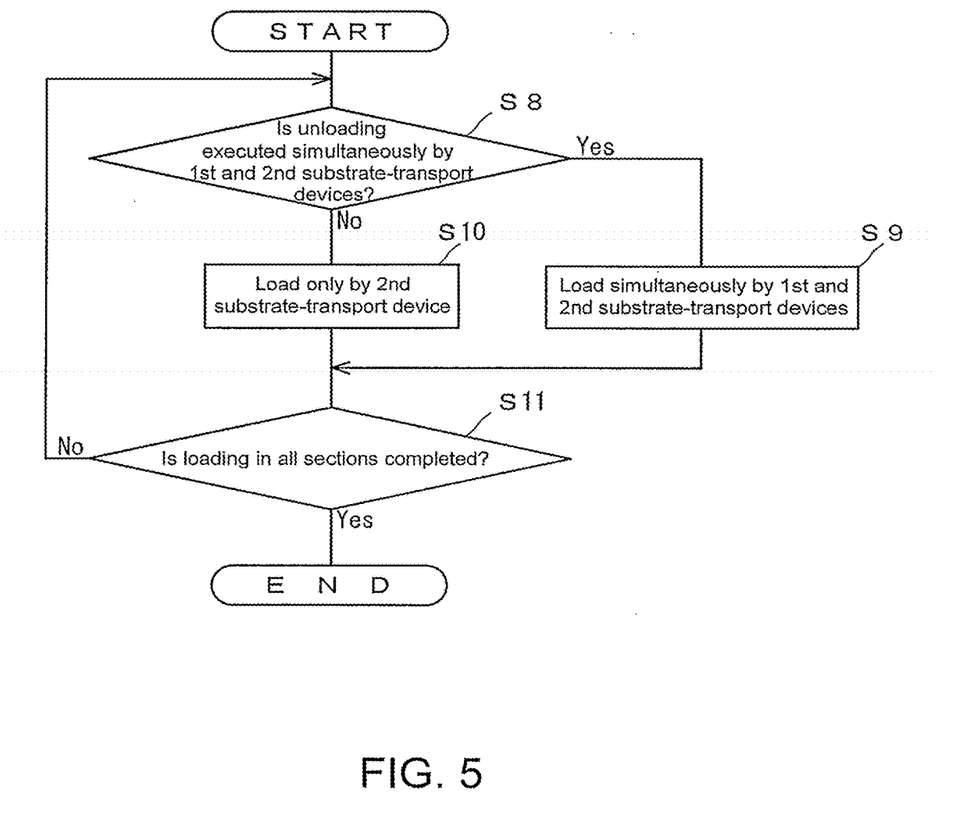
FIG. 5 is a flowchart showing the substrate transport program (when loading substrates).

More specifically, as shown in FIG. 5, memory unit 19 of substrate processing system 1 stores information about whether wafers (W) have been unloaded from carrier (C) by simultaneously using first and second substrate-transport devices (29, 30) or by using only second substrate-transport device 30. Then, at the time of loading wafers (W) from delivery table 14 to carrier (C), the unloading information is retrieved from memory unit 19 to determine whether or not the five wafers (W) have been unloaded from carrier (C) by simultaneously using first and second substrate-transport devices (29, 30) (third determination process (S8)).

When five wafers (W) have been unloaded from carrier (C) by simultaneously using first and second substrate-transport devices (29, 30), the five wafers (W) are simultaneously loaded from delivery table 14 to carrier (C) by simultaneously using first and second substrate-transport devices (29, 30) (first loading process (S9)). By contrast, when first and second substrate-transport devices (29, 30)

are not used simultaneously to unload five wafers (W) at the same time (when wafers (W) were unloaded one at a time by using only second substrate-transport device 30), a total of five wafers (W) are loaded from delivery table 14 to carrier (C) by using second substrate-transport device 30 (second loading process (S10)).

The above-described third determination process (S8) to second loading process (S10) is conducted on each section of carrier (C), and when wafers (W) in all the sections are loaded back, the process is determined to be completed (completion determination process (S11)).

In the aforementioned substrate processing system 1, depending on the detected status of wafers (W) accommodated in carrier (C), a process is selected for simultaneously driving first and second substrate-transport devices (29, 30) so that wafers (W) are unloaded from carrier (C) by simultaneously using first and second transport devices (29, 30), or a process is selected for driving only second substrate-transport device 30 so that wafers (W) are unloaded from carrier (C) by using only second substrate-transport device 30. When unloading of wafers (W) from carrier (C) is determined not to be executable by simultaneously driving first and second substrate-transport devices (29, 30), it is further determined whether unloading of wafers (W) from carrier (C) is executable by driving only second substrate-transport device 30. When unloading of wafers (W) from carrier (C) is determined to be executable by using only second substrate-transport device 30, only second substrate-transport device 30 is driven so as to unload wafers (W) from carrier (C). Accordingly, even under conditions where wafers (W) are conventionally unable to be unloaded from carrier (C), wafers (W) are continuously transported, thus enhancing the throughput of substrate processing system 1. Here, the respective numbers of wafers (W) transportable by first and second substrate-transport devices (29, 30) may be set the same. In addition, if there is no need to transport only one wafer (W), the number of wafers (W) transportable by second substrate-transport device 30 may be more than one. However, it is preferred to set a smaller number of wafers (W) to be transportable by second substrate-transport device 30 than that for first substrate-transport device 29, because unloading of wafers (W) is more likely to be executable in second determination process (S4). The number of transportable wafers (W) is more preferred to be one for substrate-transport device 30, because chances of wafers (W) being transported are even higher.

A substrate processing apparatus may be provided with a substrate accommodation-status detection device for detecting the status of substrates accommodated in a carrier (for example, distances between vertically aligned substrates). In addition, the substrate processing apparatus may be provided with a substrate-transport device capable of simultaneously transporting multiple substrates (five substrates, for example) from/to a carrier.

Before and after processing, multiple substrates (25 substrates, for example) are loaded or unloaded all at once while being accommodated in a carrier in the substrate processing apparatus. A carrier is structured to have holding members vertically aligned so as to horizontally hold each substrate separately so that multiple substrates are horizontally accommodated with spaces allotted in a vertical direction.

At the time of unloading substrates from a carrier in the substrate processing apparatus, the status of the substrates accommodated in a carrier is detected by using a substrate accommodation-status detection device. Then, based on the detected results, it is determined whether unloading multiple substrates simultaneously from a carrier is executable by using a substrate-transport device. When simultaneous unloading is determined to be executable, forks formed in the substrate-transport device for holding substrates are inserted among substrates accommodated in the carrier so that multiple substrates are simultaneously unloaded from the carrier by being held on their respective forks. On the other hand, if simultaneous unloading of multiple substrates from a carrier is determined not to be executable, the operator is alerted and the operation is suspended until the operator completes resetting procedures.

In such a substrate processing apparatus, when simultaneous unloading of multiple substrates is determined not to be executable based on the status of the substrates accommodated in a carrier, and thus the following process is temporarily suspended until the operator completes resetting procedures, the throughput of the substrate processing apparatus may be lowered.

A substrate processing apparatus according to an embodiment of the present invention has a substrate accommodation-status detection device to detect the status of substrates accommodated in a carrier; a first substrate-transport device and a second substrate-transport device to transport the substrates from/to the carrier; and a control device which controls the first substrate-transport device and second substrate-transport device based on the detection result obtained by the substrate accommodation-status detection device. Based on the detection result obtained by the substrate accommodation-status detection device, the control device selects a process in which the substrates are unloaded from the carrier by simultaneously driving the first and second substrate-transport devices, or a process in which the substrates are unloaded from the carrier by driving only the second substrate-transport device.

Based on the detection result obtained by the substrate accommodation-status detection device, when the control device determines that unloading of the substrates from the carrier is not executable by simultaneously driving the first substrate-transport device and second substrate-transport device, the control device further determines whether unloading of the substrates from the carrier is executable by driving only the second substrate-transport device. When such an unloading option is determined to be executable, only the second substrate-transport device is driven to unload the substrates from the carrier.

The second substrate-transport device is structured to transport one substrate.

The first substrate-transport device is structured to transport multiple substrates simultaneously.

If substrates are unloaded from the carrier by driving only the second substrate-transport device at the time of unloading, then only the second substrate-transport device is driven by the control device when loading the substrates back into the carrier.

The control device determines which unloading process to be taken for each set of substrates divided to have a maximum number of substrates transportable simultaneously by the first and second substrate-transport devices.

The control device determines whether or not the unloading operation is executable by detecting if there are enough spaces maintained between substrates accommodated in the carrier so as to allow insertion of forks equipped in the first substrate-transport device and second substrate-transport device for holding substrates.

In a substrate transport method according to another embodiment of the present invention, substrates are transported by first and second substrate-transport devices from/to a carrier based on the status of the substrates accommodated in the carrier. In such a method, depending on the detection result obtained by the substrate accommodation-status detection device, a process is selected for unloading substrates from the carrier either by simultaneously driving the first substrate-transport device and second substrate-transport device or by driving only the second transport device.

Based on the accommodation-status of the substrates, if unloading of substrates from the carrier is not executable by simultaneously driving the first substrate-transport device and second substrate-transport device, then it is further determined whether unloading of the substrates from the carrier is executable by driving only the second substrate-transport device. When such an option is determined to be executable, the substrates are unloaded from the carrier by driving only the second substrate-transport device.

According to yet another embodiment of the present invention, a non-transitory computer-readable medium stored thereon a program that when executed by an information processing apparatus, causes the information processing apparatus to execute a process for transporting substrates in the substrate processing apparatus. The process includes detecting a status of substrates accommodated in a carrier inside a substrate processing apparatus by a substrate accommodation-status detection device in the substrate processing apparatus, and determining, by a control device including processing circuitry based on a detection result of the substrate accommodation-status detection device, a selection between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier. The substrate processing apparatus includes a substrate-transport device including the first substrate-transport sub-device which unloads the substrates from the carrier and the second substrate-transport sub-device which unloads the substrates from the carrier, and the substrate processing apparatus includes a substrate processing device which processes the substrates unloaded from the carrier.

According to an embodiment of the present invention, the throughput of the substrate processing apparatus is enhanced.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate processing apparatus, comprising:
   a substrate processing device configured to process substrates unloaded from a carrier;
   a substrate accommodation-status detection device configured to detect a status of the substrates accommodated in the carrier;
   a substrate-transport device comprising a first substrate-transport sub-device configured to unload the substrates from the carrier and a second substrate-transport sub-device configured to unload the substrates from the carrier;
   a control device comprising processing circuitry configured to control the first substrate-transport sub-device and the second substrate-transport sub-device based on a detection result of the substrate accommodation-status detection device,
   wherein the processing circuitry of the control device is configured to determine a selection, based on the detection result of the substrate accommodation-status detection device, between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier.

2. A substrate processing apparatus according to claim 1, wherein the processing circuitry of the control device is configured to determine, based on the detection result of the substrate accommodation-status detection device, whether only the second substrate-transport sub-device is capable of unloading the substrates from the carrier by driving only the second substrate-transport sub-device when the processing circuitry of the control device determines that the first and second substrate-transport sub-devices are not capable of simultaneously unloading the substrates from the carrier by simultaneously driving the first and second substrate-transport sub-devices, and drive only the second substrate-transport sub-device such that only the second substrate-transport sub-device unloads the substrates from the carrier when the processing circuitry of the control device determines that only the second substrate-transport sub-device is capable of unloading the substrates from the carrier by driving only the second substrate-transport sub-device.

3. A substrate processing apparatus according to claim 1, wherein the second substrate-transport sub-device is configured to unload one substrate at a time.

4. A substrate processing apparatus according to claim 1, wherein the first substrate-transport sub-device is configured to unload a plurality of substrates simultaneously.

5. A substrate processing apparatus according to claim 1, wherein the processing circuitry of the control device is configured to drive only the second substrate-transport sub-device such that only the second substrate-transport sub-device loads the substrates processed by the substrate processing device into the carrier when only the second substrate-transport sub-device unloads the substrates from the carrier by driving only the second substrate-transport sub-device.

6. A substrate processing apparatus according to claim 1, wherein the processing circuitry of the control device is configured to determine the selection for each set of substrates divided to have a maximum number of substrates transportable simultaneously by the first and second substrate-transport sub-devices.

7. A substrate processing apparatus according to claim 1, wherein the first and second substrate-transport sub-devices comprise a plurality of folks each configured to hold one substrate, and the processing circuitry of the control device is configured to determine that the substrates are not capable of being unloaded by the first and second substrate-transport sub-devices when the substrates accommodated in the carrier do not have a space between the substrates such that a folk is capable of being inserted into the space.

8. A substrate processing apparatus according to claim 2, wherein the second substrate-transport sub-device is configured to unload one substrate at a time.

9. A substrate processing apparatus according to claim 2, wherein the first substrate-transport sub-device is configured to unload a plurality of substrates simultaneously.

10. A substrate processing apparatus according to claim 2, wherein the processing circuitry of the control device is configured to drive only the second substrate-transport sub-device such that only the second substrate-transport sub-device loads the substrates processed by the substrate processing device into the carrier when only the second substrate-transport sub-device unloads the substrates from the carrier by driving only the second substrate-transport sub-device.

11. A substrate processing apparatus according to claim 2, wherein the processing circuitry of the control device is configured to determine the selection for each set of substrates divided to have a maximum number of substrates transportable simultaneously by the first and second substrate-transport sub-devices.

12. A substrate processing apparatus according to claim 2, wherein the first and second substrate-transport sub-devices comprise a plurality of folks each configured to hold one substrate, and the processing circuitry of the control device is configured to determine that the substrates are not capable of being unloaded by the first and second substrate-transport sub-devices when the substrates accommodated in the carrier do not have a space between the substrates such that a folk is capable of being inserted into the space.

13. A method for transporting substrates in a substrate processing apparatus, comprising:
   detecting a status of substrates accommodated in a carrier inside a substrate processing apparatus by a substrate accommodation-status detection device in the substrate processing apparatus; and
   determining, by a control device comprising processing circuitry based on a detection result of the substrate accommodation-status detection device, a selection between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier,
   wherein the substrate processing apparatus comprises a substrate-transport device comprising the first substrate-transport sub-device configured to unload the substrates from the carrier and the second substrate-transport sub-device configured to unload the substrates from the carrier, and the substrate processing apparatus includes a substrate processing device configured to process the substrates unloaded from the carrier.

14. A method for transporting substrates substrate according to claim 13, further comprising:
   driving only the second substrate-transport sub-device such that only the second substrate-transport sub-device unloads the substrates from the carrier when the processing circuitry of the control device determines that only the second substrate-transport sub-device is capable of unloading the substrates from the carrier by driving only the second substrate-transport sub-device,
   wherein the determining comprises determining, by the processing circuitry of the control device based on the detection result of the substrate accommodation-status detection device, whether only the second substrate-transport sub-device is capable of unloading the substrates from the carrier by driving only the second substrate-transport sub-device when the processing circuitry of the control device determines that the first and second substrate-transport sub-devices are not capable of simultaneously unloading the substrates from the carrier by simultaneously driving the first and second substrate-transport sub-devices.

15. A method for transporting substrates substrate according to claim 13, wherein the second substrate-transport sub-device is configured to unload one substrate at a time.

16. A method for transporting substrates substrate according to claim 13, wherein the first substrate-transport sub-device is configured to unload a plurality of substrates simultaneously.

17. A method for transporting substrates substrate according to claim 13, further comprising:
   driving, by the processing circuitry of the control device, only the second substrate-transport sub-device such that only the second substrate-transport sub-device loads the substrates processed by the substrate processing device into the carrier when only the second substrate-transport sub-device unloads the substrates from the carrier by driving only the second substrate-transport sub-device.

18. A method for transporting substrates substrate according to claim 13, wherein the determining comprises determining, by the processing circuitry of the control device, the selection for each set of substrates divided to have a maximum number of substrates transportable simultaneously by the first and second substrate-transport sub-devices.

19. A method for transporting substrates substrate according to claim 13, wherein the first and second substrate-transport sub-devices comprise a plurality of folks each configured to hold one substrate, and the determining comprises determining, by the processing circuitry of the control device, that the substrates are not capable of being unloaded by the first and second substrate-transport sub-devices when the substrates accommodated in the carrier do not have a space between the substrates such that a folk is capable of being inserted into the space.

20. A non-transitory computer-readable medium stored thereon a program that when executed by an information processing apparatus, causes the information processing apparatus to execute a process for transporting substrates in the substrate processing apparatus, comprising:
   detecting a status of substrates accommodated in a carrier inside a substrate processing apparatus by a substrate accommodation-status detection device in the substrate processing apparatus; and
   determining, by a control device comprising processing circuitry based on a detection result of the substrate accommodation-status detection device, a selection between a process in which the processing circuitry of the control device simultaneously drives the first and second substrate-transport sub-devices such that the first and second substrate-transport sub-devices simultaneously unload the substrates from the carrier and a process in which the processing circuitry of the control device drives only the second substrate-transport sub-device such that only the second substrate-transport sub-device unloads the substrates from the carrier,
   wherein the substrate processing apparatus comprises a substrate-transport device comprising the first substrate-transport sub-device configured to unload the substrates from the carrier and the second substrate-transport sub-device configured to unload the substrates from the carrier, and the substrate processing apparatus includes a substrate processing device configured to process the substrates unloaded from the carrier.

* * * * *

UNITED STATES PATENT AND TRADEMARK OFFICE
CERTIFICATE OF CORRECTION

PATENT NO. : 10,043,692 B2
APPLICATION NO. : 15/252364
DATED : August 7, 2018
INVENTOR(S) : Go Ayabe et al.

It is certified that error appears in the above-identified patent and that said Letters Patent is hereby corrected as shown below:

On the Title Page

Item (73), the Assignee's information is incorrect. Item (73) should read:
--(73) Assignee: TOKYO ELECTRON LIMITED, Minato-ku (JP)--

Signed and Sealed this
Twenty-fifth Day of June, 2019

Andrei Iancu
*Director of the United States Patent and Trademark Office*